United States Patent
Sato

(10) Patent No.: US 10,147,737 B2
(45) Date of Patent: Dec. 4, 2018

(54) SEMICONDUCTOR MEMORY DEVICE AND METHOD FOR MANUFACTURING SAME

(71) Applicant: Toshiba Memory Corporation, Minato-ku (JP)

(72) Inventor: Mitsuru Sato, Yatomi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/017,874

(22) Filed: Feb. 8, 2016

(65) Prior Publication Data
US 2017/0025435 A1    Jan. 26, 2017

Related U.S. Application Data

(60) Provisional application No. 62/195,129, filed on Jul. 21, 2015.

(51) Int. Cl.
| | |
|---|---|
| *H01L 21/28* | (2006.01) |
| *H01L 27/115* | (2017.01) |
| *H01L 29/10* | (2006.01) |
| *H01L 29/788* | (2006.01) |
| *H01L 27/11582* | (2017.01) |
| *H01L 27/1157* | (2017.01) |
| *H01L 27/11565* | (2017.01) |

(52) U.S. Cl.
CPC ..... *H01L 27/11582* (2013.01); *H01L 27/1157* (2013.01); *H01L 27/11565* (2013.01)

(58) Field of Classification Search
CPC .......... H01L 21/28282; H01L 27/1157; H01L 29/1037
See application file for complete search history.

(56) References Cited

U.S. PATENT DOCUMENTS

| | | | |
|---|---|---|---|
| 8,372,720 B2 | 2/2013 | Fukuzumi et al. | |
| 8,729,624 B2 | 5/2014 | Fukuzumi et al. | |
| 9,035,374 B2 | 5/2015 | Fukuzumi et al. | |
| 2009/0268523 A1* | 10/2009 | Maejima ................. | G11C 5/02 365/185.11 |
| 2010/0200906 A1* | 8/2010 | Kidoh ............... | H01L 27/11578 257/324 |
| 2010/0213538 A1* | 8/2010 | Fukuzumi ............... | G11C 5/02 257/326 |
| 2010/0237402 A1* | 9/2010 | Sekine ............. | H01L 27/11551 257/324 |
| 2010/0238732 A1* | 9/2010 | Hishida ............. | G11C 16/0483 365/185.17 |
| 2012/0043599 A1* | 2/2012 | Katsumata .......... | H01L 27/1157 257/314 |

(Continued)

*Primary Examiner* — Moazzam Hossain
*Assistant Examiner* — Long H Le
(74) *Attorney, Agent, or Firm* — Oblon, McClelland, Maier & Neustadt, L.L.P.

(57) ABSTRACT

According to one embodiment, a semiconductor memory device includes a substrate; a stacked body including a plurality of electrode layers; a select gate; a first insulating film; and a semiconductor film provided in the stacked body and in the substrate. The select gate includes a first portion provided on the substrate and spreading on a first plane crossing a stacking direction of the stacked body, and a second portion provided in the substrate and provided integrally with the first portion. The first insulating film is provided between the select gate and the substrate.

17 Claims, 7 Drawing Sheets

(56) References Cited

U.S. PATENT DOCUMENTS

| 2012/0206961 | A1* | 8/2012 | Kito | G11C 16/0483 |
| | | | | 365/185.2 |
| 2015/0200204 | A1 | 7/2015 | Fukuzumi et al. | |
| 2016/0211272 | A1* | 7/2016 | Koka | H01L 27/11582 |
| 2016/0343718 | A1* | 11/2016 | Lu | H01L 27/1157 |

* cited by examiner

SEMICONDUCTOR MEMORY DEVICE AND METHOD FOR MANUFACTURING SAME

CROSS-REFERENCE TO RELATED APPLICATIONS

This application is based upon and claims the benefit of priority from U.S. Provisional Patent Application 62/195,129 field on Jul. 21, 2015; the entire contents of which are incorporated herein by reference.

FIELD

Embodiments described herein relate generally to a semiconductor memory device and a method for manufacturing same.

BACKGROUND

There is a stacked semiconductor memory device including memory cells that are three-dimensionally disposed for increasing the degree of integration of memory. The semiconductor memory device includes a plurality of channel bodies extending in a stacking direction and a plurality of electrode layers that extend in a direction intersecting the stacking direction and are arranged in the stacking direction. A plurality of memory cells are formed between the channel bodies and the electrode layers.

DETAILED DESCRIPTION

Figure 1:
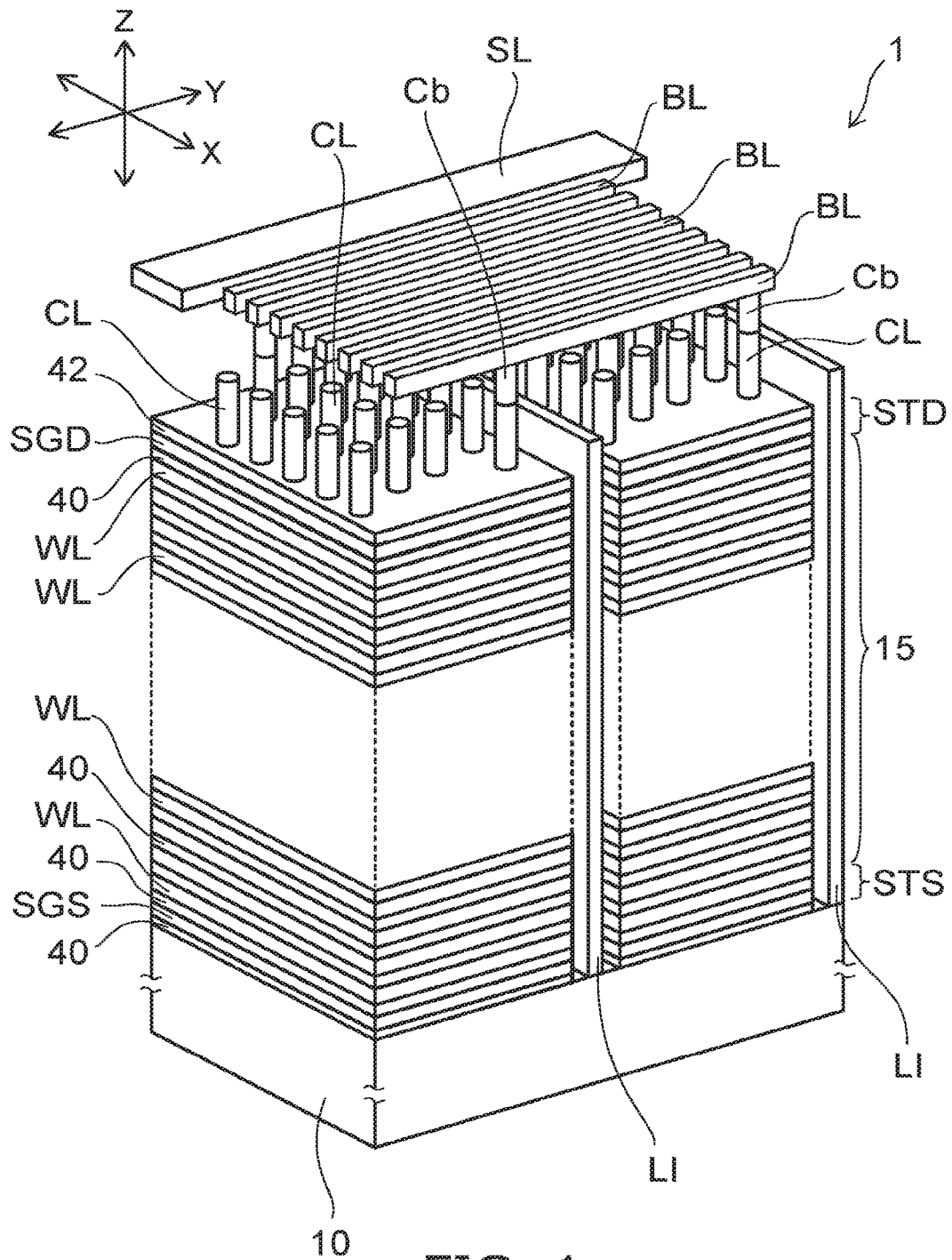
FIG. 1 is a schematic perspective view of a memory cell array of an embodiment.

According to one embodiment, a semiconductor memory device includes a substrate; a stacked body provided on the substrate and including a plurality of electrode layers separately stacked each other; a select gate provided between the substrate and the stacked body; a first insulating film; and a semiconductor film provided in the stacked body and in the substrate, extending in the stacking direction. The select gate includes a first portion provided on the substrate and spreading on a first plane crossing a stacking direction of the stacked body, and a second portion provided in the substrate and provided integrally with the first portion. The first insulating film is provided between the select gate and the substrate.

Hereinafter, embodiments will be described with reference to the drawings. In the drawings, the same elements are denoted by the same reference sign.

An example of a configuration of a memory cell array 1 of the embodiment will be described with reference to FIG. 1.

FIG. 1 is a schematic perspective view of the memory cell array 1 of the embodiment. Incidentally, in FIG. 1, illustration of insulating layers between electrode layers and the like is omitted to make the drawing easy to see.

In FIG. 1, two directions parallel to a major surface of a substrate 10 and perpendicular to each other are an X-direction and a Y-direction, and a direction perpendicular to both the X-direction and the Y-direction is a Z-direction (stacking direction).

As shown in FIG. 1, the memory cell array 1 includes a stacked body 15, respective select gates (a source side select gate SGS, a drain side select gate SGD), a plurality of columnar portions CL, an interconnect layer LI and an upper layer interconnect. FIG. 1 shows bit lines BL and a source line SL as the upper layer interconnect.

The stacked body 15 is provided on the substrate 10. The source side select gate SGS is provided between the stacked body 15 and the substrate 10. The drain side select gate SGD is provided on the stacked body 15. The substrate is, for example, the semiconductor substrate including silicon.

The stacked body 15 includes a plurality of electrode layers WL and a plurality of insulating parts 40. The plurality of electrode layers WL is separately stacked each other. The plurality of insulating parts 40 including, for example, air gaps (gaps) is provided between the plurality of electrode layers WL. Incidentally, the stacked layer number of the electrode layers WL shown in the drawing is an example, and the stacked layer number of the electrode layers WL is arbitrary.

The electrode layer WL is surrounded by, for example, a block insulating film 35 described later (see FIG. 2A). The block insulating film 35 is provided between the electrode layer WL and the insulating part 40.

The electrode layer WL contains a metal. The electrode layer WL contains at least one of, for example, tungsten, molybdenum, titanium nitride and tungsten nitride, and may contain silicon or metal silicide. The source side select gate SGS and the drain side select gate SGD contain the same material as the electrode layer WL.

The thickness of the drain side select gate SGD and the thickness of the source side select gate SGS are thicker than, for example, the thickness of the one electrode layer WL, and plural layers may be provided. Incidentally, the thickness of the drain side select gate SGD and the thickness of the source side select gate SGS may be equal to or thinner than the thickness of the one electrode layer WL, and in that case, plural layers may be provided similarly to the foregoing. Incidentally, the "thickness" here means the thickness in the stacking direction (Z-direction). The configuration of the source side select gate SGS will be described later.

The plurality of columnar portions CL extending in the Z-direction is provided in the stacked body 15. The columnar portion CL is provided in, for example, a cylindrical shape or an elliptic cylindrical shape. The plurality of columnar portions CL is provided in, for example, a staggered arrangement. Alternatively, the plurality of columnar portions CL may be provided in a square grid pattern along the X-direction and the Y-direction. The columnar portions CL are electrically connected to the substrate 10.

Figure 2A:
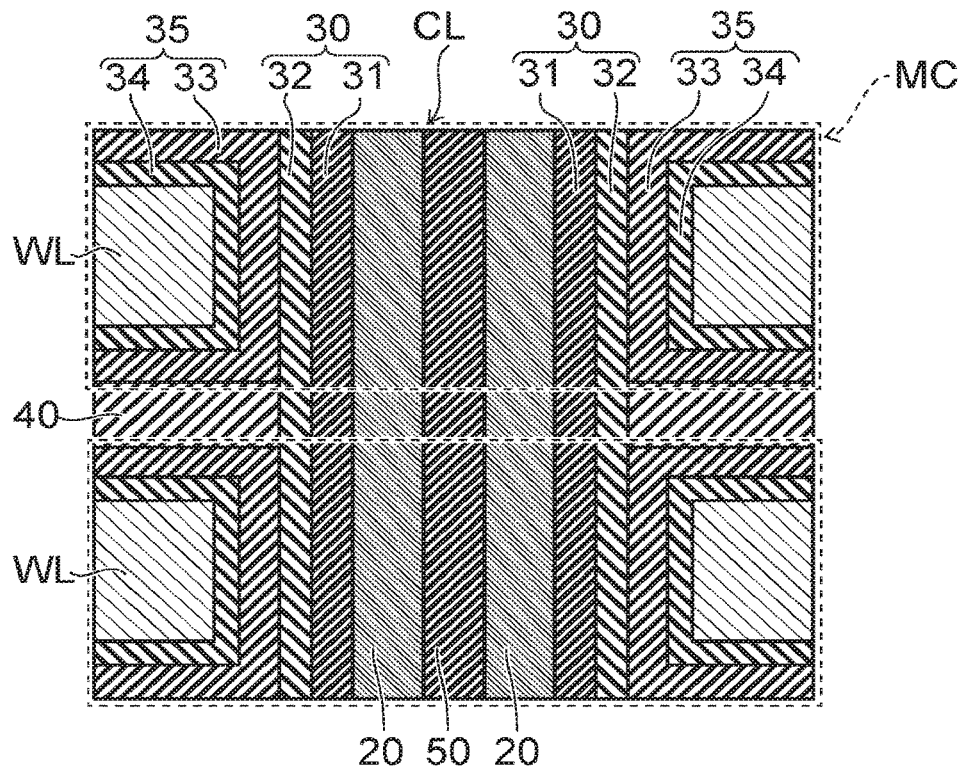
FIG. 2A and FIG. 2B are enlarged schematic sectional views of a part of the columnar portion of the embodiment.

The columnar portion CL includes a channel body 20, a memory film 30 (second insulating film) and a core insulating film 50 shown in FIG. 2A. The memory film 30 is provided between the electrode layer WL and the channel body 20 and between the insulating part 40 and the channel body 20. The memory film 30 surrounds a side surface of the channel body 20. The memory film 30 and the channel body 20 extend in the Z-direction.

The core insulating film 50 is provided inside the channel body 20. Incidentally, the channel body 20 may be, for example, columnar. For example, the core insulating film 50 may not be provided inside the channel body 20.

The channel body 20 is, for example, a film mainly containing silicon. The core insulating film 50 includes, for example, a silicon oxide film and may include an air gap.

The interconnect layer LI extending in the X-direction and the Z-direction in the stacked body 15 is provided in the stacked body 15. The interconnect layer LI is sandwiched between the stacked bodies 15. An insulating film 43 (see FIG. 3A) is provided on a side wall of the interconnect layer LI. A conductive film 45 (see FIG. 3A) is provided inside the insulating film.

A lower end of the interconnect layer LI is provided in the substrate 10. A bottom surface of the interconnect layer LI is separated from a bottom surface of the columnar portion CL, and is electrically connected to the channel body 20 (semiconductor film) in the columnar portion CL with the substrate 10 between the bottom surface of the interconnect layer LI and the channel body 20. An upper end of the interconnect layer LI is electrically connected to the source line SL with a not-shown contact part between the upper end of the interconnect layer LI and the source line SL.

The plurality of bit lines BL (for example, metal films) is provided above the stacked body 15. The plurality of bit lines BL is separated from each other in the X-direction and extends in the Y-direction.

An upper end of the channel body 20 is electrically connected to the bit line BL, and the respective bit lines BL extend in the Y-direction. A lower end 20u of the channel body 20 is provided in the substrate 10 and contacts the substrate 10. A side surface of the lower end 20u is not surrounded by the memory film 30. The lower end 20u is provided at a position lower than the bottom surface of the memory film 30.

The plurality of columnar portions CL is provided in the areas separated in the Y-direction via the interconnect layer LI, and the plurality of channel bodies 20 selected one by one in respective areas is connected to one common bit line BL.

A drain side selection transistor STD is provided at an upper end part of the columnar portion CL, and a source side selection transistor STS is provided at a lower end part.

A memory cell MC, the drain side selection transistor STD and the source side selection transistor STS are vertical transistors in which a current can flow in the stacking direction (Z-direction) of the stacked body 15.

The respective select gates SGD and SGS function as gate electrodes (control gates) of the respective selection transistors STD and STS. An insulating film functioning as a gate insulating film of each of the selection transistors STD and STS is provided between each of the select gates SGD and SGS and the channel body 20.

The plurality of memory cells MC is provided between the drain side selection transistor STD and the source side selection transistor STS, the electrode layers WL of the respective layers function as control gates in the memory cells MC.

The plurality of memory cells MC, the drain side selection transistor STD and the source side selection transistor STS are connected in series through the channel body 20, and constitute one memory string. The memory string is provided in, for example, a staggered arrangement in a plane direction parallel to the X-Y plane, so that the plurality of memory cells MC is three-dimensionally provided in the X-direction, the Y-direction and the Z-direction.

The semiconductor memory device of the embodiment can electrically freely perform erasing and writing of data, and can hold memory contents even if power is turned off.

An example of the memory cell MC of the embodiment will be described with reference to FIG. 2A and FIG. 2B.

Figure 2B:
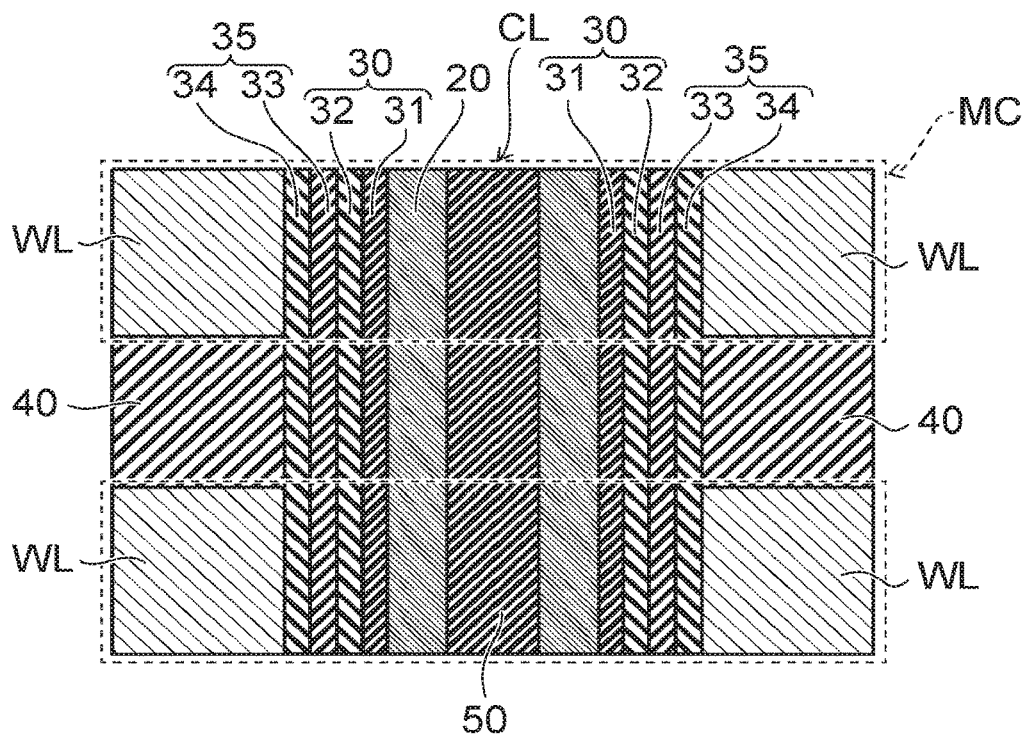

FIG. 2A and FIG. 2B are enlarged schematic sectional view of a part of the columnar portion CL of the embodiment.

The memory cell MC is, for example, of a charge trap type, and includes the electrode layer WL, the block insulating film 35, the memory film 30, the channel body 20 and the core insulating film 50.

The channel body 20 functions as a channel in the memory cell MC, and the electrode layer WL functions as a control gate of the memory cell MC. A charge storage film 32 functions as a data memory film and stores a charge injected from the channel body 20. The block insulating film 35 contacting the electrode layer WL prevents the charge stored in the charge storage film 32 from diffusing into the electrode layer WL. That is, the memory cell MC having a structure in which the control gate surrounds the periphery of the channel is formed in a crossing portion between the channel body 20 and each of the electrode layers WL.

The memory film 30 includes, for example, the charge storage film 32 and a tunnel insulating film 31. The tunnel insulating film 31 is provided to contact the channel body 20. The charge storage film 32 is provided between block insulating film 35 and the tunnel insulating film 31.

The block insulating film 35 includes, for example, a cap film 34 and a block film 33. The block film 33 is provided between the cap film 34 and the charge storage film 32. The block film 33 is, for example, a silicon oxide film.

The cap film 34 is provided to contact the electrode layer. The cap film 34 includes a film having higher dielectric constant than the block film 33.

Since the cap film 34 is provided to contact the electrode layer WL, back-tunneling electrons injected from the electrode layer WL in erasing can be suppressed, and charge blocking properties can be enhanced.

The charge storage film 32 includes many trap sites for capturing charges. The charge storage film 32 includes, for example, at least one of a silicon nitride film and hafnium oxide.

The tunnel insulating film 31 becomes a potential barrier when charges are injected from the channel body 20 into the charge storage film 32 or charges stored in the charge storage film 32 diffuse into the channel body 20. The tunnel insulating film 31 includes, for example, a silicon oxide film.

Alternatively, a stacked film (ONO film) having a structure in which a silicon nitride film is sandwiched between a pair of silicon oxide films may be used as the tunnel insulating film 31. When the ONO film is used as the tunnel insulating film 31, an erasing operation can be performed at low electric field as compared to a single layer of a silicon oxide film.

Incidentally, for example, as shown in FIG. 2B, the block insulating film 35 may be provided in the columnar portion CL. At this time, the block insulating film 35 extends in the Z-direction, and the electrode layer WL contacts the insulating part 40.

An example of the configuration of the semiconductor memory device of the embodiment will be described with reference to FIG. 3A and FIG. 3B.

Figure 3A:
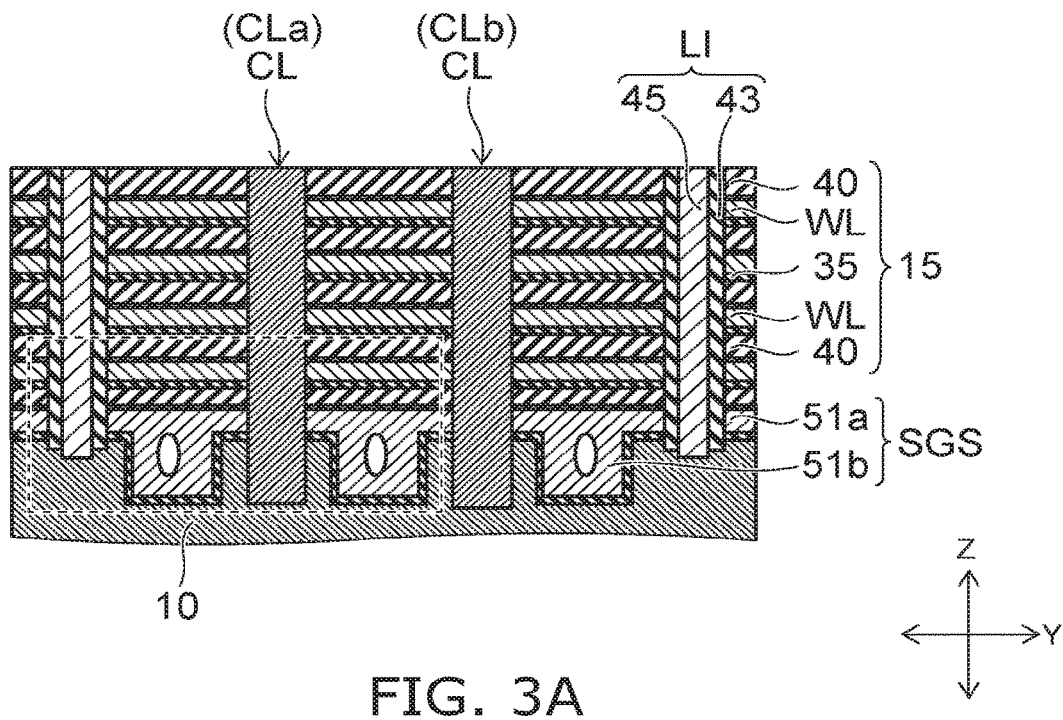
FIG. 3A is a schematic sectional view of the semiconductor memory device of the embodiment.
Figure 3B:
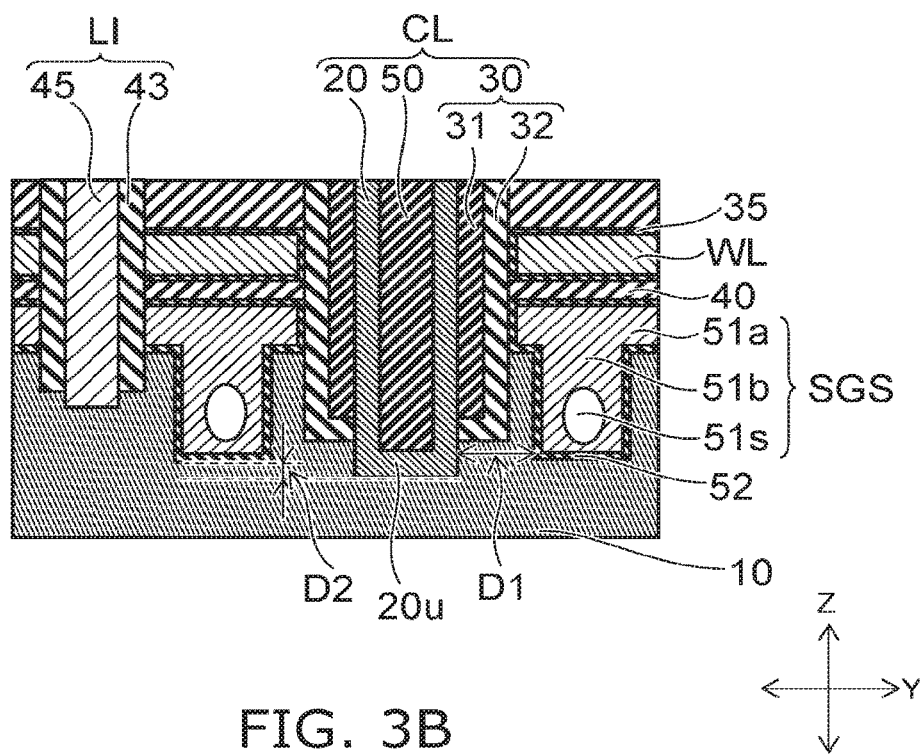
FIG. 3B is an enlarged schematic sectional view of the embodiment.

FIG. 3A is a schematic sectional view of the semiconductor memory device of the embodiment, and FIG. 3B is an enlarged schematic sectional view of a dotted line part in FIG. 3A. Incidentally, in FIG. 3A, illustration of the configuration above the stacked body 15 is omitted.

As shown in FIG. 3A and FIG. 3B, the source side select gate SGS includes a first portion 51a and a second portion 51b. The source side select gate SGS may include, for example, a gap 51s surrounded by the second portion 51b.

The first portion 51a is provided on the substrate 10 and spreads on the XY plane. The first portions 51a are separated in the Y-direction with the interconnect layer LI.

The second portion 51b is provided in the substrate 10. The second portion 51b extends in the Z-direction from the lower surface of the first portion 51a to the substrate 10. The second portion 51b is separated from the stacked body 15.

The second portion 51b is provided on the columnar portion CL with the substrate 10 between the second portion 51b and the columnar portion CL. The second portion 51b is provided between the columnar portion CL and the interconnect layer LI, and the substrate 10 is provided between the second portion 51b and the columnar portion CL and between the second portion 51b and the interconnect layer LI. The upper surface of the substrate 10 is provided between the second portion 51b and the columnar portion CL, and between the second portion 51b and the interconnect layer LI.

When the plurality of columnar portions CL is provided, the second portion 51b is provided between a first columnar portion CLa and a second columnar portion CLb, and the substrate 10 is provided between the second portion 51b and the first columnar portion CLa, and between the second portion 51b and the second columnar portion CLb.

An insulating film 52 (first insulating film) is integrally provided between the first portion 51a and the substrate 10, and between the second portion 51b and the substrate 10. The insulating film 52 is integrally provided from the lower surface of the first portion 51a to the lower surface of the second portion 51b. The insulating film 52 is in contact with the upper surface of the substrate 10, and the upper surface, lower surface and side surface of the first portion 51a. The insulating film 52 provided on the side surface of the first portion 51a is in contact with the side surface of the columnar portion CL. A portion of the insulating film 52 in contact with the bottom surface of the second portion 51b is separated from the bottom surface of the interconnect layer LI and the bottom surface of the columnar portion CL.

The first portion 51a and the second portion 51b contain the same material as the electrode layer WL. The insulating film 52 contains the same material as the block insulating film 35.

A distance D1 between a lower end 20u of the channel body 20 and the second portion 51b is 30 nm or more, and may be 30 nm or more and less than 60 nm. The position of the lower end 20u is lower than, for example, the upper surface of the substrate 10 by 60 nm or more. Thus, the distance between the lower end 20u and the second portion 51b is shorter than the distance between the lower end 20u and the upper surface of the substrate 10.

A height difference D2 between the bottom surface of the second portion 51b and the lower end 20u is 0 nm or more and 20 nm or less. That is, as long as the height difference D2 is within the above range, the bottom surface of the second portion 51b may be higher than or lower than the bottom surface of the channel body 20 or may be flush with each other. The second portion 51b is closer to the lower end 20u than the first portion 51a. The second portion 51b is farther from the upper surface of the substrate 10 than the first portion 51a.

An example of a layout of the embodiment will be described with reference to FIG. 4A and FIG. 4B.

Figure 4A:
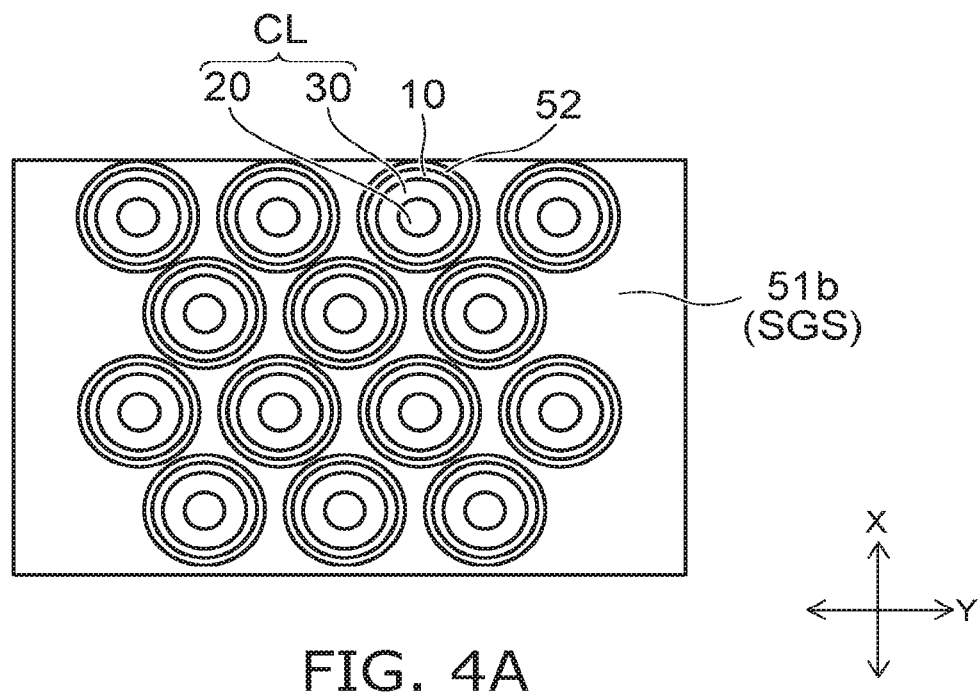
FIG. 4A and FIG. 4B are schematic plan views of the semiconductor memory device of the embodiment.
Figure 4B:
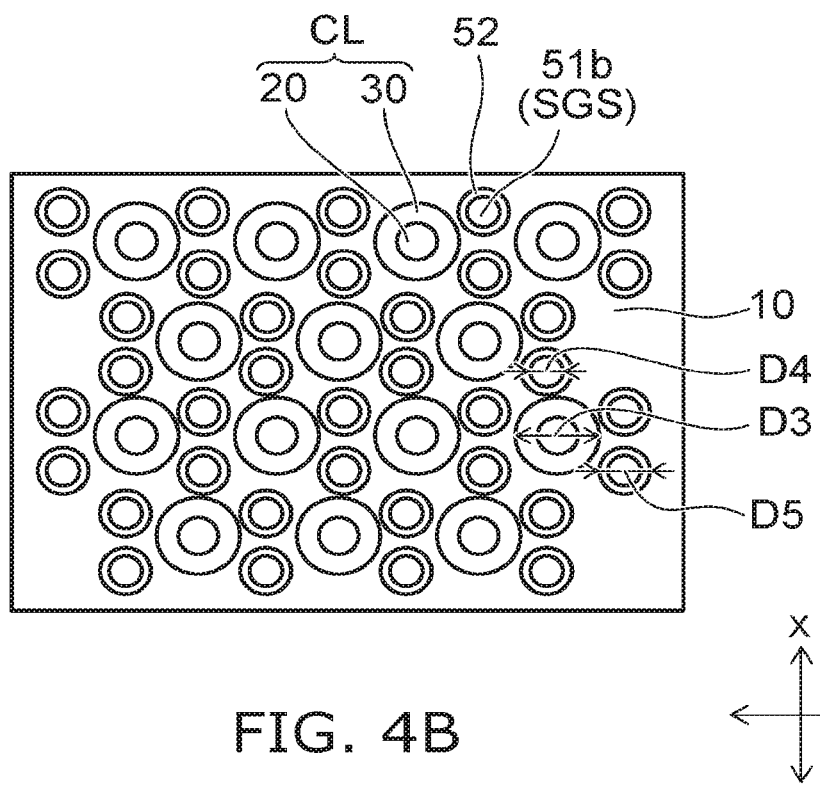

FIG. 4A and FIG. 4B are schematic plan views including a portion where the second portion 51b is provided.

As shown in FIG. 4A, the second portion 51b spreads on the XY plane. The plurality of columnar portions CL is provided in a staggered arrangement. The substrate 10 surrounds each of the plurality of columnar portions CL.

The second portion 51b surrounds each of the plurality of columnar portions CL with the substrate 10 between the second portion 51b and each of the columnar portions CL. The insulating film 52 is provided between the second portion 51b and the substrate 10. The second portion 51b is separated from the columnar portion CL.

For example, as shown in FIG. 4B, the plurality of second portions 51b may be columnar and may be provided separately from each other. At this time, the plurality of second portions 51b is provided to be adjacent to the columnar portions CL with the substrate 10 between the plurality of second portions 51b and the columnar portions CL. A side surface of each of the second portions 51b and a side surface of each of the columnar portions CL are surrounded by the substrate 10. The insulating film 52 is provided between the second portions 51b and the substrate 10 and is surrounded by the substrate 10. The second portion 51b is separated from the columnar portion CL.

As viewed in the Z-direction, a maximum diameter D3 of the columnar portion CL (insulating film) is larger than, for example, a maximum diameter D4 of the second portion 51b and a maximum diameter D5 of the insulating film 52. Incidentally, arrangement places of the plurality of second portions 51b are arbitrary.

Incidentally, when an epitaxially grown layer exists on a surface of a semiconductor substrate, the substrate 10 may mean an area including not only the semiconductor substrate but also the epitaxially grown layer.

An example of a method for manufacturing the semiconductor memory device of the embodiment will be described with reference to FIG. 5A to FIG. 7C.

Figure 5A:
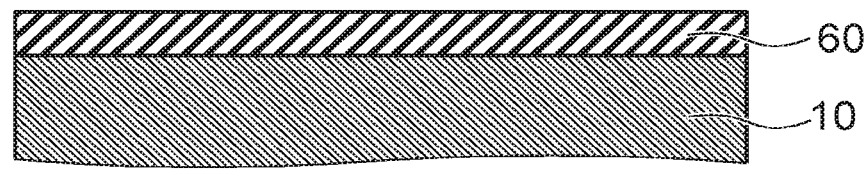
FIG. 5A to FIG. 7C are schematic cross-sectional views showing a method for manufacturing the semiconductor memory device of the embodiment.

As shown in FIG. 5A, an insulating layer 60 is formed on a substrate 10. The insulating layer 60 is used as a mask member when the substrate 10 is processed, and includes, for example, a silicon oxide film.

Figure 5B:
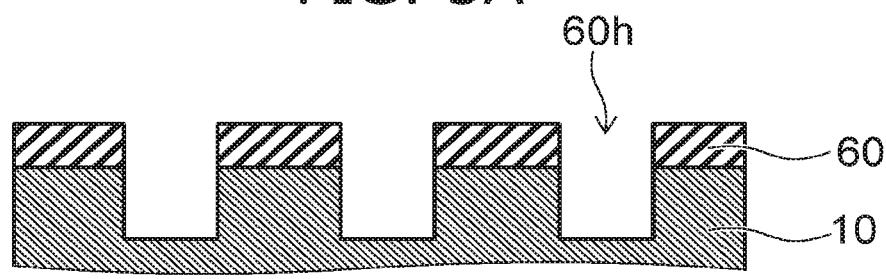

As shown in FIG. 5B, a part of the insulating layer 60 is removed. An upper surface of the substrate 10 exposed in the removed portion is removed. Hereby, a space 60h is formed in the substrate 10. A second portion 51b (projection part) described later is formed in the space 60h.

Figure 5C:
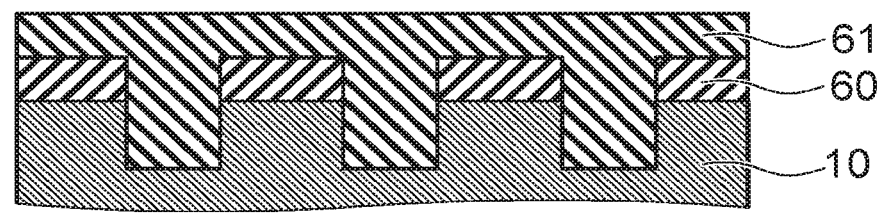

As shown in FIG. 5C, a first layer 61 is formed in the space 60h and on the insulating layer 60. The first layer 61 includes, for example, a silicon nitride film.

Figure 6A:
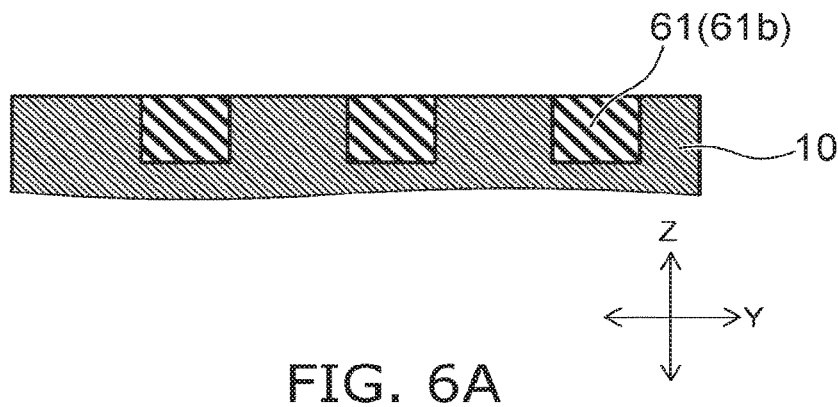

As shown in FIG. 6A, the insulating layer 60 and the first layer 61 formed on the substrate 10 are removed. After the first layer 61 is removed to the surface of the substrate 10 by using, for example, a CMP method (Chemical Mechanical Polish) or an RIE method (Reactive Ion Etching), the insulating layer 60 is removed. At this time, a second portion 61b of the insulating layer 60 is remained on the substrate 10.

Figure 6B:
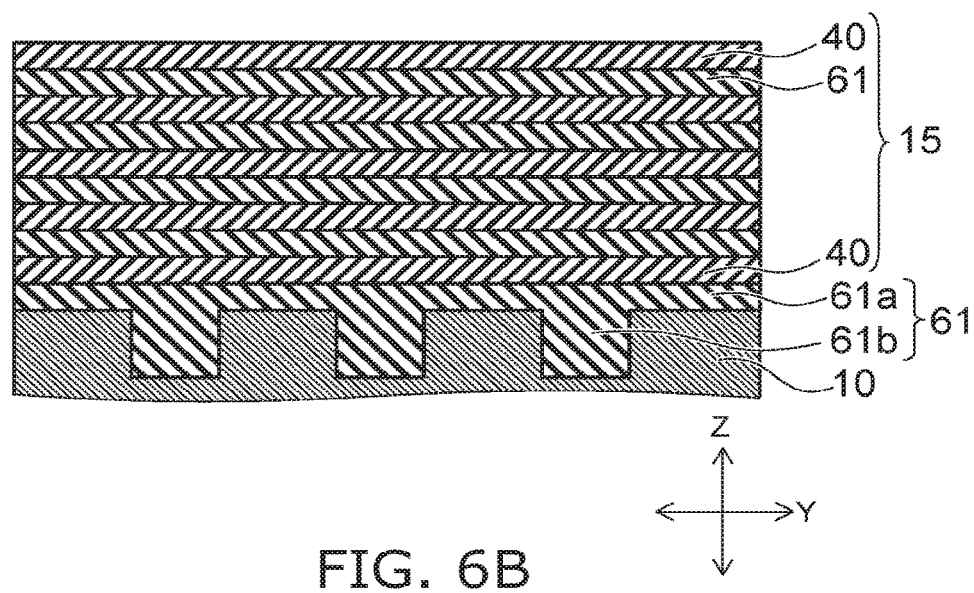

As shown in FIG. 6B, a first portion 61a of the first layer 61 is formed on the substrate 10 and the second portion 61b. A stacked body 15 in which an insulating part 40 and a first layer 61 are alternately stacked is formed on the first portion 61a. The insulating part 40 includes, for example, a silicon oxide film.

Figure 6C:
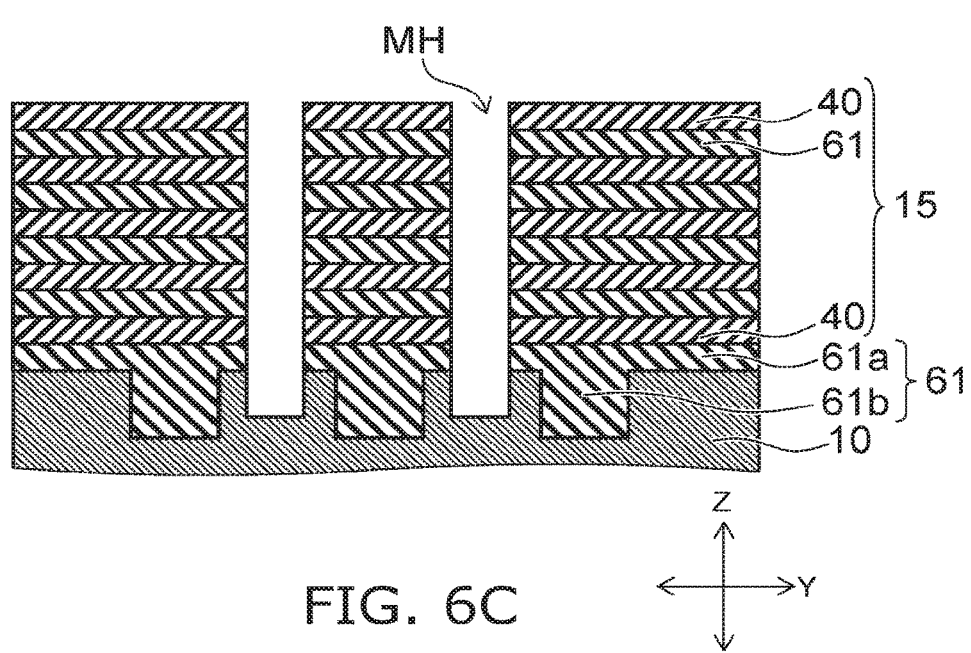

As shown in FIG. 6C, a hole MH piercing the stacked body 15 to reach the substrate 10 is formed. As a method of forming the hole MH, for example, an RIE method using a not-shown mask is used. At this time, the hole MH is separated from the second portion 61b formed in the substrate 10.

Figure 7A:
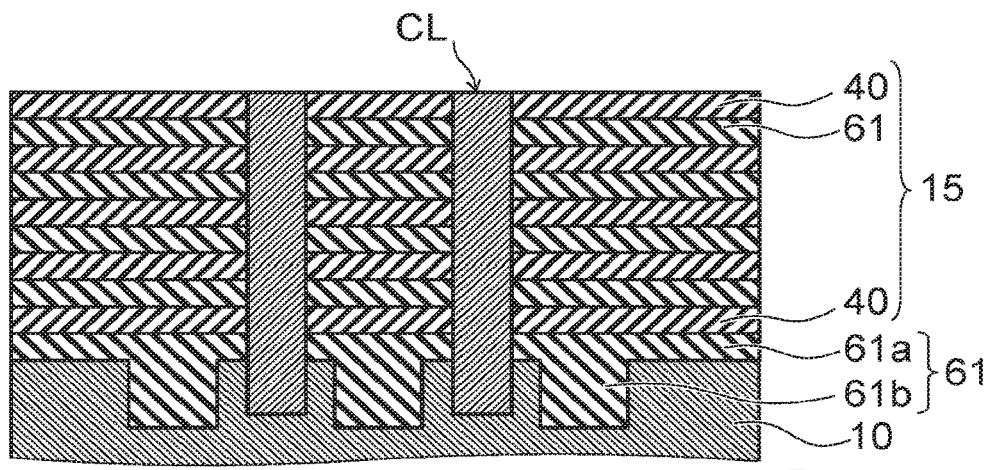

As shown in FIG. 7A, the respective films shown in FIG. 3B are formed in the hole MH. For example, the charge storage film 32 is formed on the side wall of the hole MH, and the tunnel insulating film 31 is formed inside the charge storage film 32. Thereafter, a hole piercing the bottom surface of the tunnel insulating film 31 to reach the substrate 10 is formed, and the channel body 20 is formed inside the tunnel insulating film 31 and in the hole. Then, the core insulating film 50 is formed inside the channel body 20. Hereby, the columnar portion CL is formed.

The channel body 20 contacts the substrate 10 and is separated from the second portion 61b formed in the substrate 10. The substrate 10 is sandwiched between the channel body 20 and the second portion 61b.

Figure 7B:
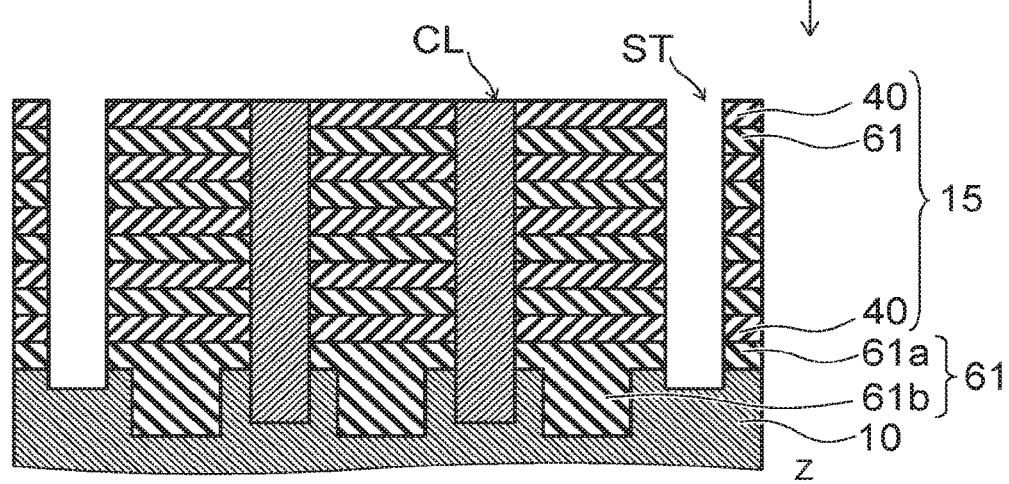

As shown in FIG. 7B, a slit ST piercing the stacked body 15 to reach the substrate 10 is formed. The slit extends in the X-direction.

Figure 7C:
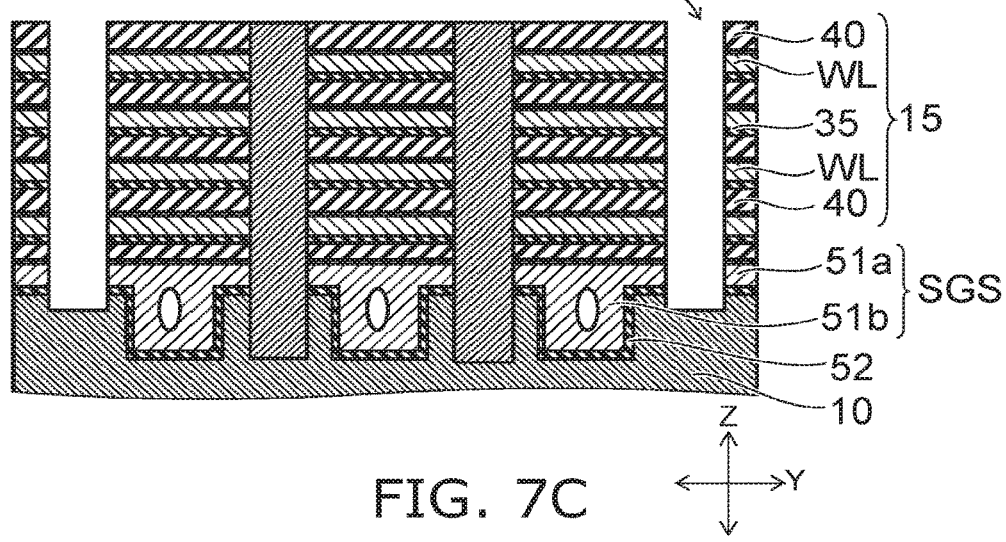

As shown in FIG. 7C, the first layer 61 is removed through the slit ST. As a method of removing the first layer 61, for example, a wet etching method using phosphoric acid is used. Hereby, a space is formed in a portion where the first layer 61 is removed.

Next, a block insulating film 35 is formed on a wall surface (side wall, upper surface, bottom surface) of the space of the stacked body 15. An insulating film 52 is formed on a wall surface of the space between the stacked body 15 and the substrate 10 (replace method). The insulating film 52 is made of the same material as the block insulating film 35.

An electrode layer WL is formed inside the block insulating film 35, and a first portion 51a and a second portion 51b are formed inside the insulating film 52. The electrode layer WL, the first portion 51a and the second portion 51b include a multi-layer structure containing, for example, titanium nitride and tungsten.

The first portion 51a is formed integrally with the second portion 51b. A distance between the second portion 51b and the channel body 20 is 30 nm or more. A height difference between the bottom surface of the second portion 51b and the bottom portion of the channel body 20 is 0 nm or more and 20 nm or less.

Thereafter, a surplus film formed in the slit ST is removed. As shown in FIG. 3A, the insulating film 43 is formed on the side wall of the slit ST, and the conductive film 45 is formed inside the insulating film 43.

Thereafter, as shown in FIG. 1, the bit lines BL and the like are formed on the stacked body 15, and the semiconductor memory device of the embodiment is formed.

Incidentally, a method of forming the electrode layer WL and the source side select gate SGS from the beginning may be used instead of forming the first layer 61. In that case, as a difference from the foregoing manufacturing method, for example, after the space 60h is formed, the insulating layer 60 is removed. Thereafter, the insulating film 52 is formed on the wall surface of the space 60h and on the upper surface of the substrate 10. The insulating film 52 is formed by, for example, thermal oxidation.

Then, the stacked body 15 in which the electrode layer WL and the insulating part 40 are alternately stacked is formed. Further, the films shown in FIG. 2B (the block insulating film 35, the memory film 30, the channel body 20 and the core insulating film 50) are formed in the hole MH formed in the stacked body 15. Thereafter, the same process as the foregoing process is performed except for the process of forming the electrode layer WL and the source side select gate SGS from the process of removing the first layer 61. Hereby, the semiconductor memory device of the embodiment is formed.

Effects of the Embodiment will be Described.

According to the embodiment, the source side select gate SGS includes the first portion 51a and the second portion 51b, the first portion 51a spreads on the XY plane, and the second portion 51b is provided in the substrate 10. Thus, the gate voltage can be applied to the vicinity of the area, and the area is provided from the surface of the substrate 10 to the bottom of the channel body 20. Hereby, the parasitic resistance in the substrate 10 can be reduced.

For example, the parasitic resistance can occur when the distance between the source side select gate SGS and the bottom surface of the channel body 20 is long. A current flowing through the surface of the substrate 10 is supplied to the bottom surface of the channel body 20, the current flows through the length portion of the columnar portion CL protruding in the substrate 10. Since a gate voltage is hard to be applied in an area, the area is provided from the surface of the substrate 10 to the bottom surface of the channel body 20, the area may cause the parasitic resistance. Thus, there is a possibility that cell current is reduced.

On the other hand, according to the embodiment, the second portion 51b of the source side select gate SGS is provided in the substrate 10. Thus, even when the columnar portion CL is formed deeply in the substrate 10, the gate voltage can be applied to the vicinity of the area, and the area is provided from the surface of the substrate 10 to the bottom of the channel body 20. Hereby, it is possible to provide the device reduced in the parasitic resistance and increased in the cell current.

For example, the distance between the surface of the substrate 10 and the channel body 20 is about 60 nm. On the other hand, according to the embodiment, the distance between the second portion 51b and the channel body 20 may be 30 nm or more. Besides, the height difference between the bottom surface of the second portion 51b and the bottom surface of the channel body 20 is 0 nm or more and 20 nm or less. Thus, the second portion 51b is closer to the channel body 20 than the first portion 51a provided on the substrate 10. That is, the area impressed with the gate voltage is reduced, the parasitic resistance is reduced, and the cell current can be increased. Incidentally, the above values are calculated in view of variation in manufacturing process. Hereby, the flowing distance of current through the substrate 10 can be shortened to about half as compared to the case when the second portion 51b is not formed.

In addition to the above, as shown in FIG. 4A, the second portion 51b spreads on, for example, the XY plane, and surrounds the side surface of the columnar portion CL with the substrate 10 between the second portion 51b and the columnar portion CL. Thus, the volume of the second portion 51b can be increased. Hereby, the efficiency of current supplied to the source side select gate SGS can be improved.

Besides, as shown in FIG. 4B, the second portion 51b is, for example, cylindrical, and the side surface of the second portion 51b is surrounded by the substrate 10. Thus, the area of the second portion 51b facing the columnar portion CL can be decreased. Hereby, the capacitance between the source side select gate SGS and the columnar portion CL can be suppressed.

Further, according to the embodiment, the second portion 51b can be formed simultaneously with the stacked body 15. Thus, as compared to the case where the substrate epitaxial growth method or the like is used, the parasitic resistance can be reduced and the cell current can be increased without increasing difficulty in processing and the number of processes.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor memory device comprising:
   a substrate;
   a stacked body provided on the substrate and including a plurality of electrode layers separately stacked each other;
   a select gate provided between the substrate and the stacked body, the select gate including a first portion provided on the substrate and spreading on a first plane crossing a stacking direction of the stacked body, and a second portion provided in the substrate and formed contiguously with the first portion and formed of the same material as the first portion;
   a first insulating film provided between the select gate and the substrate; and
   a semiconductor film provided in the stacked body and in the substrate, the semiconductor film extending in the stacking direction,
   wherein a distance between the second portion and the semiconductor film is 30 nm or more and less than 60 nm, and
   a distance between a lower end of the semiconductor film and the second portion is shorter than a distance between the lower end and an upper surface of the substrate.

2. The device according to claim 1, wherein the second portion spreads on the first plane, and surrounds a side surface of the semiconductor film with the substrate between the second portion and the semiconductor film.

3. A semiconductor memory device comprising:
   a substrate;
   a stacked body provided on the substrate and including a plurality of electrode layers separately stacked each other;
   a select gate provided between the substrate and the stacked body, the select gate including
      a first portion provided on the substrate and spreading on a first plane crossing a stacking direction of the stacked body, and
      a second portion provided in the substrate and formed contiguously with the first portion and formed of the same material as the first portion;
   a first insulating film provided between the select gate and the substrate; and
   a semiconductor film provided in the stacked body and in the substrate, the semiconductor film extending in the stacking direction,
   wherein a height difference between a bottom surface of the second portion and a bottom surface of the semiconductor film is 0 nm or more and 20 nm or less.

4. The device according to claim 3, further comprising an interconnect layer provided in the substrate and in the stacked body, and extending in the stacking direction and a first direction crossing the stacking direction, wherein
   a bottom surface of the interconnect layer is separated from a portion of the first insulating film in contact with a bottom surface of the second portion.

5. The device according to claim 4, wherein the second portion is provided between the semiconductor film and the interconnect layer.

6. The device according to claim 3, further comprising a second insulating film surrounding a side surface of the semiconductor film and extending in the stacking direction, wherein
   a bottom surface of the semiconductor film is lower than a bottom surface of the second insulating film.

7. The device according to claim 6, wherein as viewed in the stacking direction, a maximum diameter of the second insulating film is larger than a maximum diameter of the second portion.

8. The device according to claim 6, wherein the second insulating film includes a charge storage film provided between the semiconductor film and the stacked body.

9. The device according to claim 6, wherein the second insulating film is in contact with the first insulating film.

10. The device according to claim 3, wherein the select gate contains a same material as the plurality of electrode layers.

11. The device according to claim 3, further comprising a block insulating film provided between the plurality of electrode layers and containing a same material as the first insulating film.

12. The device according to claim 3, further comprising a block insulating film provided between the semiconductor film and the plurality of electrode layers, the block insulating film extending in the stacking direction.

13. A semiconductor memory device comprising:
   a substrate;
   a stacked body provided on the substrate and including a plurality of electrode layers separately stacked each other;
   a columnar portion provided in the stacked body and in the substrate and extending in a stacking direction of the stacked body, the columnar portion including a semiconductor film being in contact with the substrate;
   a select gate provided between the substrate and the stacked body, the select gate including
      a first portion provided on the substrate and spreading on a first plane crossing a stacking direction of the stacked body, and
      a plurality of second portions provided in the substrate and formed contiguously with the first portion and formed of the same material as the first portion, the second portions being columnar, the second portions adjacently provided with the columnar portion.

14. The device according to claim 13, wherein, as viewed in the stacking direction, a maximum diameter of the columnar portion is larger than a maximum diameter of the second portions.

15. The device according to claim 13, wherein a distance between the second portions and the semiconductor film provided in the substrate is 30 nm or more and less than 60 nm.

16. The device according to claim 13, wherein a height difference between a bottom surface of the second portions and a bottom surface of the semiconductor film provided in the substrate is 0 nm or more and 20 nm or less.

17. The device according to claim 13, further comprising an insulating film provided between the second portions and the substrate, wherein, as viewed in the stacking direction, a maximum diameter of the columnar portion is larger than a maximum diameter of the insulating film.

\* \* \* \* \*